United States Patent [19]

Ebbert

[11] 3,898,535

[45] Aug. 5, 1975

[54] MOUNTING FRAME FOR ELECTRONIC COMPONENTS

[75] Inventor: Robert J. Ebbert, Rochester, Mich.

[73] Assignee: Design Products Corporation, Troy, Mich.

[22] Filed: Sept. 12, 1963

[21] Appl. No.: 308,411

[52] U.S. Cl. .......... 317/100; 174/16 HS; 317/101 R; 339/17 C

[51] Int. Cl.$^2$ ........................ H05K 7/20; H05K 7/18

[58] Field of Search ....... 174/68.5, 15, 16, 52, 52.6, 174/52.5; 317/100, 101, 99; 339/17, 18, 198

[56] References Cited

UNITED STATES PATENTS

| | | | |
|---|---|---|---|
| 2,821,669 | 1/1958 | Christian | 317/101 |
| 3,176,191 | 3/1965 | Rowe | 317/101 |
| 3,178,506 | 4/1965 | Dereich et al. | 174/52 |
| 3,190,952 | 6/1965 | Bitko | 174/52 |
| 3,191,099 | 6/1965 | Rezek | 317/101 |

OTHER PUBLICATIONS

Forman, German Printed Application 1,117,164 November, 1961.

*Primary Examiner*—D. L. Clay
*Attorney, Agent, or Firm*—Harness, Dickey & Pierce

EXEMPLARY CLAIM

10. In a mounting frame for electronic components, an open, generally rectangular frame of rigid electrically insulative material, and a plurality of pins of electrically conductive material extending through one leg of said open frame in spaced parallel relation, said pins being of a one-piece construction and having terminal portions supported in said one leg and adapted to be plugged into a mating connector and having main portions extending inwardly in said open frame and into a leg of said open frame opposite from said one leg.

13 Claims, 8 Drawing Figures

PATENTED AUG 5 1975

3,898,535

SHEET 2

MOUNTING FRAME FOR ELECTRONIC COMPONENTS

This invention relates to mounting frames for electronic components, and more particularly to means for pre-assembling electronic components in a required sub-circuit and removably mounting the assembled components as part of a larger circuit.

It is known to have a group of electrical or electronic components, such as transistorized or miniaturized elements, mounted on a printed circuit board which has terminals removably mountable in a larger panel, for the purpose of replacing the panel should one of its components become defective or if a different sub-circuit is desired. Such arrangements require a different printed circuit board for each sub-circuit, and make it difficult to test the internal functions of the various components while the circuit board is mounted in place. Furthermore, printed circuit boards exhibit sensitivity to heat damage when the components are being soldered in place, especially if one or more components are to be replaced. Printed circuit board arrangements, when used as mounting boards, furthermore do not afford protection to the mounted components should the board be dropped, and by limiting air circulation they restrict heat dissipation, especially from high power semiconductors.

It is an object of the present invention to provide a novel and improved mounting frame for electrical or electronic components which overcomes the aforementioned disadvantages of previously known mounting means, and which permits any type of sub-circuit to be assembled using mounting frames of identical construction.

It is a further object to provide an improved mounting frame of this type which will permit testing of the internal functions of individual components without the necessity of removing the mounting frame from a circuit panel on which it is mounted.

It is a further object to provide an improved mounting frame having these characteristics, on which commercially available components having lead wires may be mounted.

It is another object to provide an improved mounting frame of this character which cannot be damaged by repeated attachment or removal of components, and in which the mounted components are fully protected from damage due to dropping of the frame.

It is also an object to provide an improved mounting frame having these characteristics, in which a full electrical connection between the component lead wires and the mounting frame pins will be insured.

Other objects, features, and advantages of the present invention will become apparent from the subsequent description, taken in conjunction with the accompanying drawings, in which.

Briefly, each of the illustrated embodiments of the invention comprises an open rectangular frame of rigid and electrically insulative material, and a plurality of electrically conductive mounting pins extending between opposite legs of the frame, or in one embodiment, secured to one leg of the frame and extending toward the other leg. The pins have projecting ends which are mountable in sockets or receptacles of a circuit panel board and are capable of supporting a plurality of electrical or electronic components which are secured thereto by spot-welding or soldering. Each component may be secured between any two or more preselected pins, depending upon the number of leads on the component and the sub-circuit which it is desired to preassemble. Certain pins may act merely as conductors, and others as connections to the panel. Two of the latter pins, such as the two end pins, could act as power input pins.

The depth or thickness on the legs of the open frame in the direction of the axis of the space which it forms is substantial, and the pins are offset from a plane passing through the central portion of the frame, a substantial space thus being provided for accommodating the mounted components so that they will not project beyond the confines of the frame in any direction. In one embodiment, the ends of the pins opposite those which are mountable in the panel are exposed by recesses in the outer surface of the frame, so that probes may be connected to preselected pins to test the internal functions of one or more components as well as the input and output.

In another embodiment of the invention, heat-conductive metal elements of relatively large mass are secured within the open frame and are adapted to support high power semiconductor elements, acting as heat sinks therefor. In this embodiment of the invention, as indicated above, the pins do not extend between opposite legs of the frame, and testing of components by probes is therefore not possible.

Figures 1, 2, 3, 4, 5:
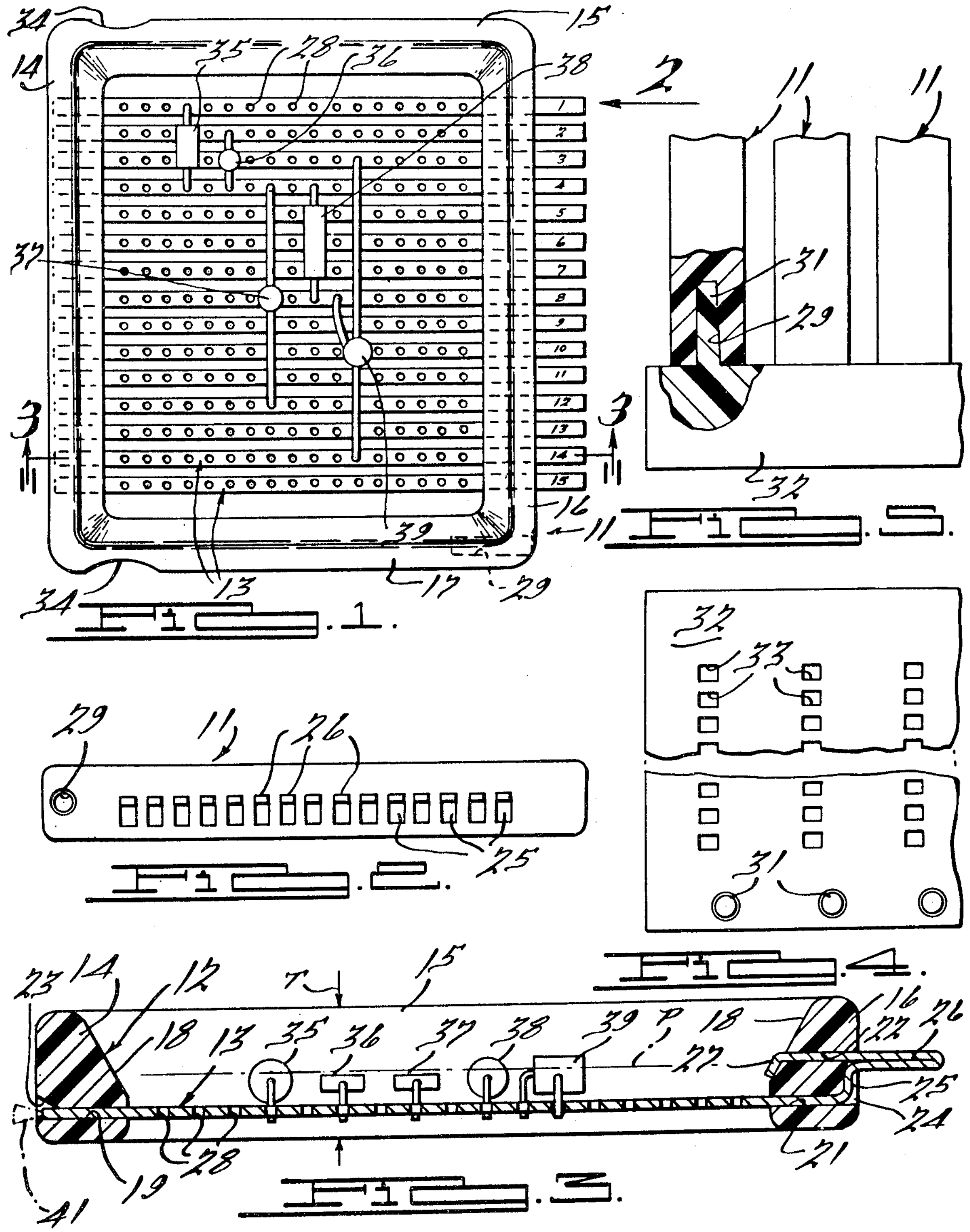
FIG. 1 is a side elevational view of a suitable form of the mounting frame of this invention, showing several components mounted thereon.
FIG. 2 is an end view of the mounting frame taken in the direction of the arrow 2 of FIG. 1 and showing the projecting ends of the pins as well as the locating aperture.
FIG. 3 is an enlarged cross-sectional view taken along the line 3—3 of FIG. 1 and showing the manner in which a pin is secured to the open frame as well as the disposition of components within the frame.
FIG. 4 is a top plan view of a circuit panel on which several mounting frames may be removably mounted.
FIG. 5 is a side view of the panel of FIG. 4, parts being sectioned to show the coaction between a locating pin on the panel and the locating recess on the frame.

Referring more particularly to the drawings, FIGS. 1 to 6 illustrate a suitable embodiment of the invention generally indicated at 11 and comprising an open frame generally indicated at 12 and pins each of which is generally indicated at 13. Frame 12 is of square or rectangular shape and is preferably fabricated in unitary fashion of a rigid and electrically insulative material. As shown in FIG. 3, the cross-sectional shape of each of the four legs 14, 15, 16 and 17 of frame 12 may be generally rectangular, but with rounded corners and a partially inclined inner surface 18. The thickness T of the four legs is uniform in the direction of the axis of the space formed by the open frame, and is sufficient to accommodate within the confines of the frame the electrical or electronic components which will be mounted therein, as later described. Leg 14 is provided with a plurality of parallel apertures 19, as seen in FIG. 3, and leg 16 is provided with a plurality of parallel apertures 21 which are aligned with apertures 19. Leg 16 is further provided with a plurality of apertures 22 which are parallel to apertures 21 and aligned therewith in planes parallel to the plane in which FIG. 3 is taken. Apertures 19 and 21 are offset a substantial distance from an imaginary plane P passing through the central portion of the frame, as seen in FIG. 3, with apertures 22 being more closely aligned with the central frame portion. Outwardly flared recesses 23 are formed at the outer ends of apertures 19 leading to the outer surface of leg 14, and recesses 24 are provided at the outer ends of apertures 21 to facilitate mounting of the pins as will hereinafter appear.

All pins 13 are of identical construction, and are fabricated of an electrically conductive metal, their cross-sectional shape being rectangular and corresponding to that of apertures 19, 21 and 22. The main portion of each pin 13 is straight, this portion being slightly shorter than the total length between the outer ends of aligned apertures 19 and 21, as seen in FIG. 3. A transversely extending shoulder 25 is formed on each pin 13 for disposition within recess 24, and a terminal portion 26 is formed on each pin by doubling back its outer end immediately past shoulder 25. The doubled back portion of the pin is of sufficient length to pass through aperture 22 and be bent inwardly against surface 18, as indicated at 27. The engagement of shoulders 25 and 27 of pin 13 with leg 16 of frame 12 will thus serve to hold the pin firmly in position within the frame.

Each pin 13 is shown as being provided with a plurality of spaced apertures 28 adapted to receive the lead wires of electrical or electronic components. Apertures 28 on all pins 13 will have the same spacing, so as to form rows as seen partially in FIG. 1 extending parallel to legs 14 and 16 of frame 12.

Frame 12 is also provided with a locating recess 29 extending inwardly at the juncture of legs 16 and 17, parallel to leg 17, and this recess is adapted to coact with a locating pin 31 formed on a conventional circuit panel 32, seen in FIGS. 4 and 5. Panel 32 is of the type having a plurality of rows of sockets or receptacles 33 connected to portions of an electrical system. The system may be of any type, such as a computer or sorting device, in which various sub-circuits and components are to be connected. The spacing between adjacent rows of receptacles 33 is sufficient to accommodate a plurality of mounting frames 11 in upright position, as seen in FIG. 5, with the terminal pin portions 26 of the mounting frames entering into receptacles 33, locating pin 31 adjacent each row of pins 33 being received by a recess 29 so as to insure proper orientation of the mounting frames. Each open frame 12 is also provided with a pair of recesses 34, as seen in FIG. 1 adjacent the junctures of legs 15 and 17 with leg 14, for finger gripping purposes so as to facilitate insertion and removal of terminals 26 into receptacles 33.

Figure 6:
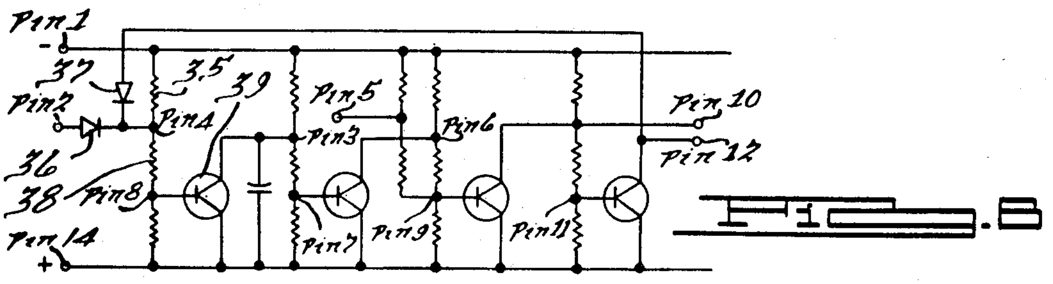
FIG. 6 is a portion of a circuit diagram which is used to explain a typical arrangement of components shown in FIGS. 1 and 3.

The mounting frame shown in FIGS. 1 to 3 has 15 pins, numbered 1 to 15 in FIG. 1, and is shown as carrying a number of electrical or electronic components. In order to facilitate understanding of the invention, these components, and their positions in the mounting frame, are described with respect to a circuit diagram partially shown in FIG. 6. It may be assumed that pin No. 1 and pin No. 14 serve as power input pins to the mounting frame. As shown in FIGS. 1 and 6, a resistor 35 is connected between pin Nos. 1 and 4, a rectifier 36 between pin Nos. 2 and 4, a rectifier 37 between pin Nos. 4 and 12, a resistor 38 between pin Nos. 4 and 8, a transistor 39 between pin Nos. 3, 8 and 14. It will be noted from FIG. 6 that some pins, such as pin Nos. 3, 4 and 8, are used merely as internal tie points, and the receptacles 33 into which the terminals of such pins are inserted will not form part of the circuitry. Other pins, such as pin Nos. 1, 2, 12 and 14 will be connected by their respective terminals and the receptacles 33 into which the terminals are inserted to the other portions of the circuit. Bear in mind that FIGS. 1 and 3 do not show all the components illustrated in FIG. 6, but merely a representative number.

The components will be secured within mounting frame 11 by passing the lead wires thereof into apertures 28 and soldering the lead wires in place, cutting off any excess lead wire length. When soldered connections are used, the solder will fill apertures 28 by capillary action and will completely surround the inserted wire, creating a greater joined surface area than is possible with printed circuit wiring. The soldered connection can also be easily opened without damage to the lead wires or to pins 13. Alternatively, the lead wires could be spot-welded in place against pins 13 without the use of apertures 28. Should the lead wires be too close to pins 13 which they cross, they may be covered with appropriate insulative sleeves (not shown).

As stated previously, the depth of open frame 12 is such that the components mounted therewithin will be within the frame confines. This is plainly visible in FIG. 3. Should the size or shape of any particular component be such as to be in interfering relation with one or more pins 13, such pins could be removed from the assembly if they are not required for connecting purposes. Obviously, any given grouping of components could be mounted in a number of ways on their frame in order to be in non-interfering relation with each other.

After mounting frames 11 have been mounted on circuit panel 32, testing of any component mounted on an individual mounting frame may be accomplished by inserting a probe, indicated partially in dot-dash lines at 41 in FIG. 3, into a recess 23 leading to a pin 13 to which the component to be tested is connected. Recesses 23 will be accessible from the tops of mounting frames 11 when they are in the position shown in FIG. 5. In this manner, individual components may be tested without having to remove the corresponding mounting frame 11 from panel 32.

It will also be observed that when mounting frames 11 are mounted on panel 32 in aligned position as seen in FIG. 5, continuous air circulation will be permitted to all the mounting frames, since their openings will be aligned with each other. In this manner, air cooling can be used to prevent overheating of components.

Figures 7, 8, 9:
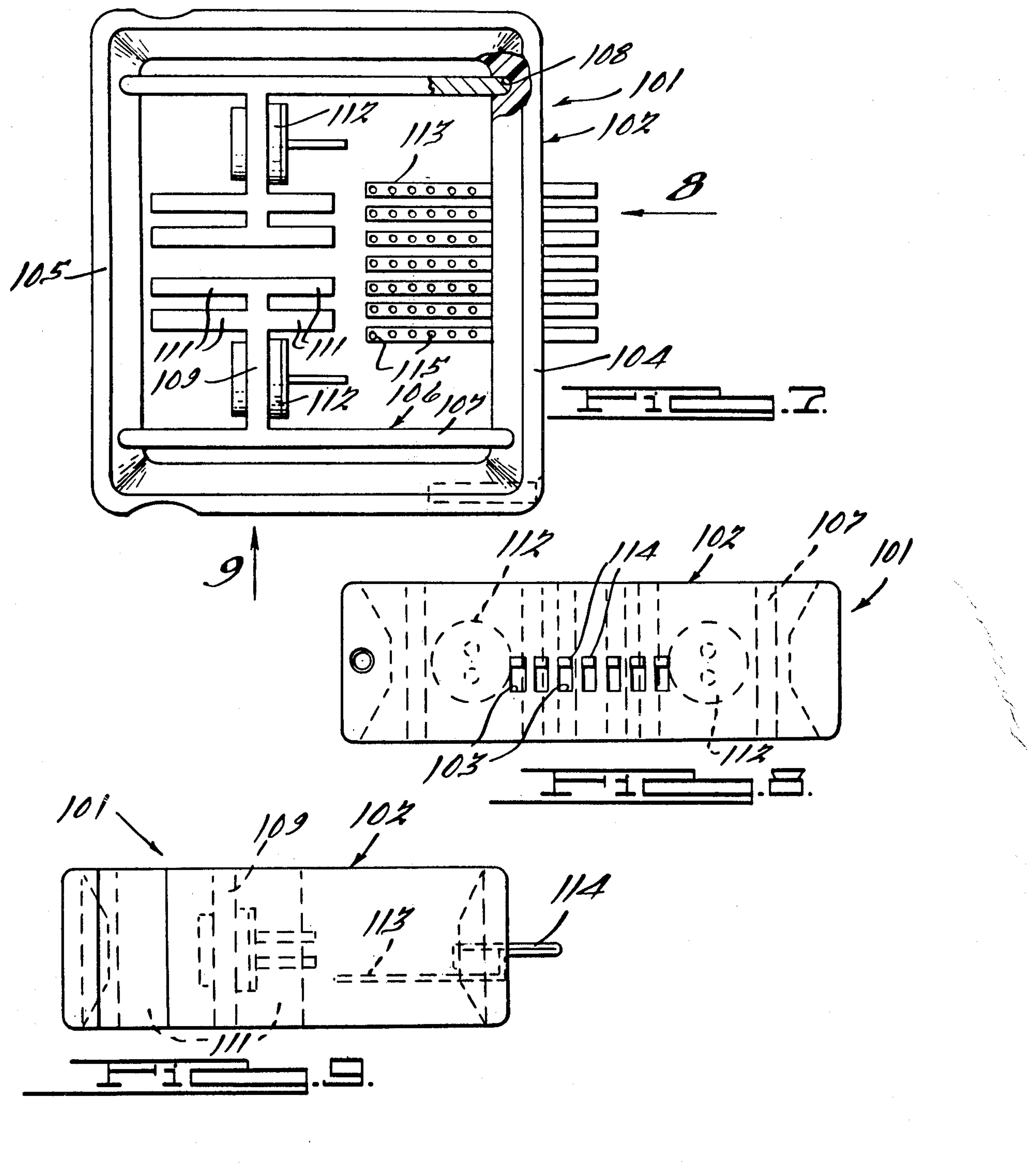
FIG. 7 is a side elevational view of a modified form of the invention which incorporates heat sinks for high power semiconductors.
FIG. 8 is an end elevational view of the frame of FIG. 7 taken in the direction of the arrow 8 thereof and showing the projecting ends of the mounting pins.
FIG. 9 is a side view of the frame of FIG. 7 taken in the direction of the arrow 9 thereof and further showing the disposition of the parts.

FIGS. 7 to 9 show a modified form of the invention generally indicated at 101 and is especially adapted for AC power switching. In this embodiment, an open rectangular frame generally indicated at 102 of electrically insulative material is provided, the frame being constructed similarly to frame 12 of the first embodiment, but with pin-receiving apertures 103 only in the central portion of one leg 104, and no pin-receiving apertures in the opposite leg 105. A pair of heat sinks generally indicated at 106 are mounted within the confines of the frame, each heat sink 106 comprising a main portion 107 extending between and secured within recesses 108 in legs 104 and 105. Each heat sink 106 further has a portion 109 extending transversely to portion 107 and toward the inner portion of the mounting frame, and a plurality of radiating portions 111 extending laterally from portion 109. Heat sinks 106 are constructed of heat-conductive metal and have substantial mass so as to absorb the heat from components such as silicon controlled rectifiers 112 secured to portions 109 thereof.

A plurality of pins 113 are mounted in apertures 103, these pins serving the same basic function as pins 13 of the previous embodiment. That is, each pin is provided with a terminal portion 114 seen in FIG. 9 adapted to be inserted in a circuit panel receptacle, and the main portion of each pin is provided with apertures 115 to facilitate the mounting of electrical or electronic components. The main pin portions are offset from a plane passing through the central portion of frame 102, as seen in FIG. 9, so that components secured thereto will be disposed within the confines of frame 102.

Because of the presence of heat sinks 106, pins 113 do not extend to or through leg 105 of frame 102, and the feature of being able to test individually components by connection of a probe to the pins, when the mounting frame is on panel 32, is not present in this embodiment. The other advantages of the invention discussed above do, however, apply to the embodiment of FIGS. 7 to 9, and it will be noted that the air circulation afforded by the open nature of the frame will be of particular importance in conjunction with heat sinks 106, since the heat absorbed by the sinks will be quickly carried off.

While it will be apparent that the preferred embodiments of the invention disclosed are well calculated to fulfill the objects above stated, it will be appreciated that the invention is susceptible to modification, variation and change without departing from the proper scope or fair meaning of the subjoined claims.

What is claimed is:

1. In a mounting frame for electronic components, an open rectangular frame of rigid electrically insulative material, and a plurality of pins of electrically conductive material extending through one leg of said open frame in spaced parallel relation, said pins having terminal portions outwardly of said open frame and main portions inwardly of said open frame, the legs of said open frame having substantial thickness in the direction of the axis of the opening formed by the open frame, said main pin portions being in a common plane parallel to and spaced from a plane passing through the central portion of said open frame, the ends of said main pin portions remote from said terminal portions extending through apertured portions of the leg of said open frame opposite said first-mentioned leg, the ends of said pins passing through said last-mentioned apertured portions being accessible to an electrical probe from the outside of said last-mentioned frame leg.

2. The combination according to claim 1, the terminal portion of each pin is a doubled-back portion of the pin projecting outwardly from the open frame, said doubled-back portion extending said first-mentioned leg.

3. The combination according to claim 1, said pins being in a common plane parallel to and spaced from a plane passing through the central portion of said open frame.

4. The combination according to claim 3, the legs of said open frame through which said pins pass having substantially rectangular cross-sectional shapes with their facing surfaces flared outwardly from each other in a direction away from said pins toward the side of said frame remote from said pins.

5. The combination according to claim 1, said pins comprising bars of rectangular cross-sectional shape and having evenly spaced apertured portions passing therethrough in the direction of the axis of the opening formed by said open frame.

6. The combination according to claim 1, said frame being further provided with a locating recess in one leg thereof extending parallel to said pins.

7. In a mounting frame for electronic components, an open rectangular frame integrally formed of rigid electrically conductive material, each of the four legs of said frame having a substantially rectangular cross-sectional shape and with its inner surface flared toward one side of the frame, a plurality of parallel pins of electrically conductive material each comprising a bar-like element of electrically conductive material, each pin having a main portion and a terminal portion, a plurality of aligned apertured portions in opposite legs of said open frame, the main portions of said pins being disposed within and extending between said apertured portions so as to extend across the space formed by said open frame, laterally bent shoulders on each of said pins resting against one leg of said open frame at one end of said main portion, the terminal portion of each pin extending outwardly from said shoulder offset from and parallel to said main pin portion and comprising a doubled back portion of said bar the outer end of which extends back through said one leg and is bent over the inner surface thereof to retain the pin in place, recesses in the opposite leg of said frame exposing the ends of said pins opposite said terminal portions so that an electrical probe may be placed in contact with any pin, and apertured portions on the main portions of said pins for receiving wire leads of electronic components, the main pin portions being in a common plane parallel to and spaced from a plane passing through the central portion of said open frame.

8. In a mounting frame for electronic components a rectangular frame of rigid electrically insulative material having a generally centrally located through opening, a plurality of spaced parallel pins of electrically conductive material mounted on one leg of said frame and having terminal portions accessible from the outside of said leg and main portions extending inwardly of said leg partially toward the opposite leg of said frame, each of said pins being of a one-piece construction and having an effective preselected length with said main portion being approximately at least one-half of said preselected length, and at least one heat sink comprising a metal heat-conductive member of substantial mass secured within the confines of said frame and within said through opening, the pins being spaced from one side of said frame a sufficient distance to accommodate electronic components secured to said pins within the confines of said frame.

9. In a mounting frame for electronic components, a rectangular frame of rigid electrically insulative material, a plurality of spaced parallel pins mounted on one leg of said frame and having terminal portions accessible from the outside of said leg and main portions extending inwardly of said leg partially toward the opposite leg of said frame, and at least one heat sink comprising a metal heat-conductive member of substantial mass secured within the confines of said frame, the pins being spaced from one side of said frame a sufficient distance to accommodate electronic components secured to said pins within the confines of said frame, said heat sink comprising a straight main portion extending between and secured to opposite legs of said frame, a mounting portion extending laterally from said main portion and adapted to support an electronic component in heat-conductive relation therewith, and heat-radiating portions extending laterally from the mounting portion, all of said heat sink portions being within the confines of the sides of said open frame.

10. In a mounting frame for electronic components, an open, generally rectangular frame of rigid electrically insulative material, and a plurality of pins of electrically conductive material extending through one leg of said open frame in spaced parallel relation, said pins being of a one-piece construction and having terminal portions supported in said one leg and adapted to be plugged into a mating connector and having main portions extending inwardly in said open frame and into a leg of said open frame opposite from said one leg.

11. The mounting frame of claim 10 in which at least some of said main portions have a plurality of connecting openings at which lead wires of electrical components can be connected to selected ones of said some of said main portions.

12. In a mounting frame for electronic components, an open frame of rigid electrically insulative material having a generally central through opening with the legs of said frame being of a small width relative to the size of said through opening, and only a single plurality of pins of electrically conductive material supported on said frame with all of said pins extending through one leg of said open frame in spaced parallel relation, each of said single plurality of pins having a terminal portion supported in said one leg and with said terminal portions extending outwardly from said one leg and adapted to be plugged into a mating connector and having a main portion extending inwardly in said open frame.

13. The mounting frame of claim 12 in which said each of said pins is of a one-piece construction and has an effective preselected length with said main portion being at least one-half of said preselected length.

* * * * *

UNITED STATES PATENT OFFICE
CERTIFICATE OF CORRECTION

Patent No. 3,898,535 Dated August 5, 1975

Inventor(s) Robert J. Ebbert

It is certified that error appears in the above-identified patent and that said Letters Patent are hereby corrected as shown below:

Column 5, line 28, "individually" should read -- individual --. Page 1, last line "13 Claims, 8 Drawing Figures" should read -- 13 Claims, 9 Drawing Figures --.

Signed and Sealed this

*sixth* Day of *January 1976*

[SEAL]

*Attest:*

RUTH C. MASON
*Attesting Officer*

C. MARSHALL DANN
*Commissioner of Patents and Trademarks*

UNITED STATES PATENT OFFICE
CERTIFICATE OF CORRECTION

PATENT NO. : 3,898,535

DATED : August 5, 1975

INVENTOR(S) : Robert J. Ebbert

It is certified that error appears in the above-identified patent and that said Letters Patent are hereby corrected as shown below: In the Drawings: Add the following sheet of drawings showing Figures 6, 7, 8 and 9:

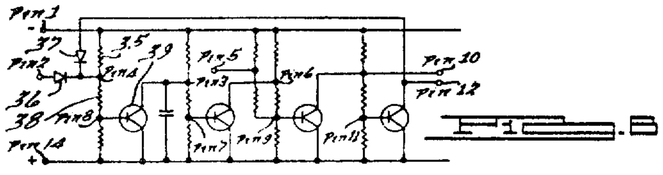

FIG. 6

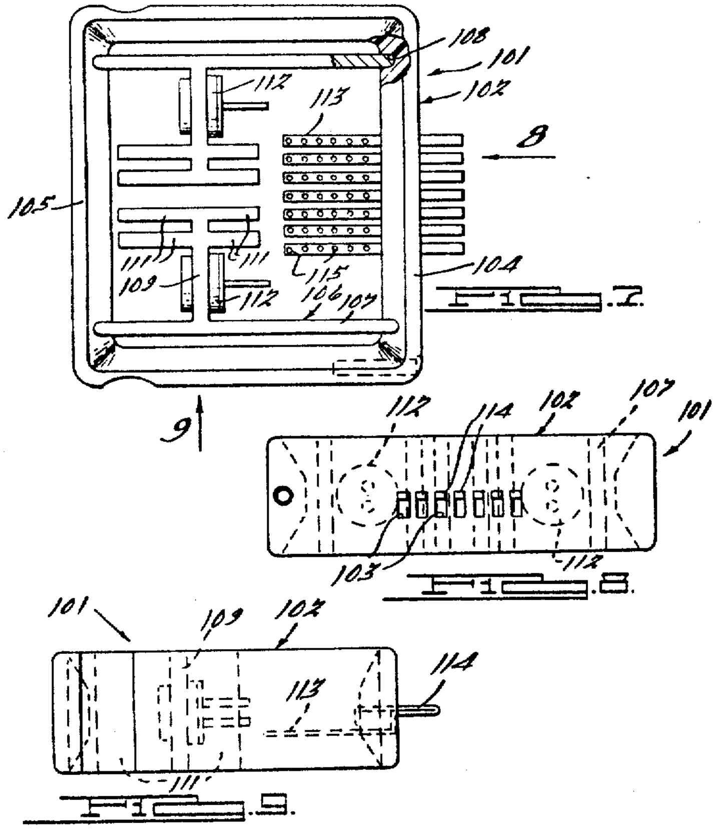

FIG. 7, FIG. 8, FIG. 9